Figure 1:
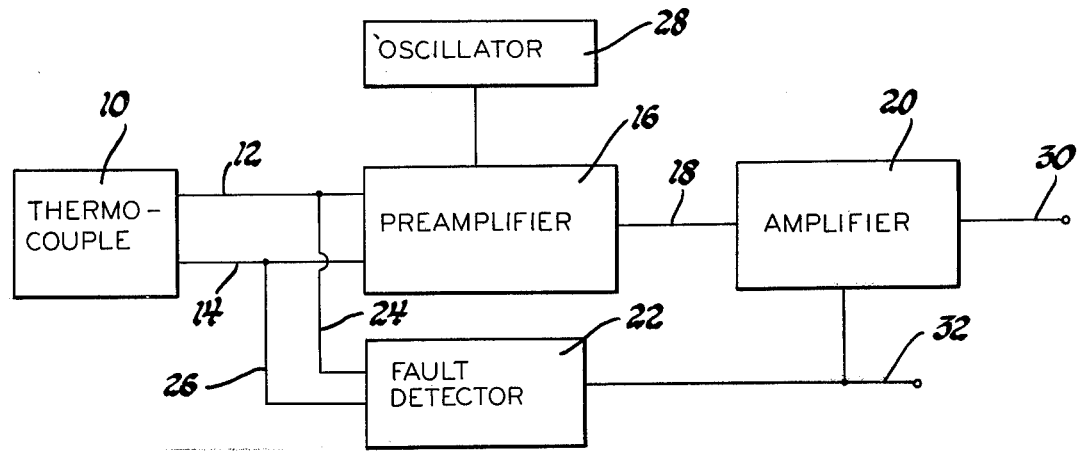

United States Patent [19]
West et al.

[11] 4,166,243
[45] Aug. 28, 1979

[54] THERMOCOUPLE FAILURE DETECTOR

[75] Inventors: Gene A. West; John A. Moretti, both of Kokomo, Ind.

[73] Assignee: General Motors Corporation, Detroit, Mich.

[21] Appl. No.: 898,615

[22] Filed: Apr. 21, 1978

[51] Int. Cl.² .................. G01R 31/02; G08B 21/00
[52] U.S. Cl. ................................... 324/51; 340/652
[58] Field of Search ............... 324/51, 52, 54, 73; 340/652, 653

[56] References Cited
U.S. PATENT DOCUMENTS

| | | | |
|---|---|---|---|
| 3,066,284 | 11/1962 | McKinley et al. | 324/51 X |
| 3,229,199 | 1/1966 | Mildner | 324/54 |
| 3,241,061 | 3/1966 | Quittner | 324/51 UX |
| 3,468,164 | 9/1969 | Sutherland | 340/652 X |
| 3,590,370 | 6/1971 | Fleischer | 340/652 X |
| 3,755,688 | 8/1973 | Hohler | 340/652 X |
| 3,906,341 | 9/1975 | Getz et al. | 324/51 X |
| 3,973,184 | 8/1976 | Raber | 324/51 |

Primary Examiner—Gerard R. Strecker
Attorney, Agent, or Firm—Warren D. Hill

[57] ABSTRACT

A circuit is provided for detecting an open condition in a thermocouple or thermocouple leads connected to a preamplifier even though the thermocouple is grounded or connected to ground through some resistance. A high frequency AC test signal is applied to both leads of the thermocouple and one of the leads is connected to a low pass filter. When the thermocouple circuit is closed, the AC signal on both leads will be substantially equal. If, however, either of the leads or the thermocouple itself is open, the AC signal will be different due to the low pass filter connected to one of the leads. That filter attenuates the signal on the associated lead as well as causing a phase shift of the two AC signals. A differential amplifier connected to the thermocouple leads detects the amplitude attenuation or the phase shift to provide an output whenever the thermocouple circuit is opened.

2 Claims, 2 Drawing Figures

THERMOCOUPLE FAILURE DETECTOR

This invention relates to a thermocouple amplifier circuit including a failure detector for providing an indication of an open thermocouple circuit.

Thermocouples are commonly used to monitor the temperature occurring in equipment or processes at a location remote from a control station. For example, a gas turbine engine on an airplane or other vehicle uses thermocouples to signify to an operator or to a control device whether operating engine temperatures are within desired ranges or to directly affect a control apparatus such as a fuel control. The thermocouple in the engine may be connected to the control station by 20 or 30 feet of lead wire. It is desirable to detect whether a break has occurred in the lead wire or whether the thermocouple has opened or become disconnected from the lead wire. It is further desirable to determine such an open condition irrespective of whether the thermocouple is isolated from ground or becomes grounded or partially grounded by becoming soaked with fuel, for example. Many schemes have been proposed for detecting open conditions in thermocouples but prior to this invention there was a need for a simple inexpensive fault detector which would detect only open thermocouple circuits and not respond to incidental grounding or partial grounding of the thermocouple.

It is therefore a general object of this invention to provide a thermocouple open circuit detection apparatus which is insensitive to the grounding or partial grounding of the thermocouple. It is a further object of the invention to provide such an open circuit detector which is inexpensive and which is reliable under diverse conditions of thermocouple failure and grounding.

The invention is carried out by providing in a system wherein a thermocouple is connected to a preamplifier circuit by a pair of thermocouple leads, an oscillator for applying identical high frequency AC test signals to both leads, a low pass filter connected to only one of the leads and an AC responsive differential amplifier circuit connected across the thermocouple leads to detect substantial differences in amplitude or phase of the AC signals on the leads, wherein the AC signals are substantially different in amplitude or phase only when the thermocouple circuit is open and the differential amplifier produces an output signal indicative of that open condition.

Figure 2:
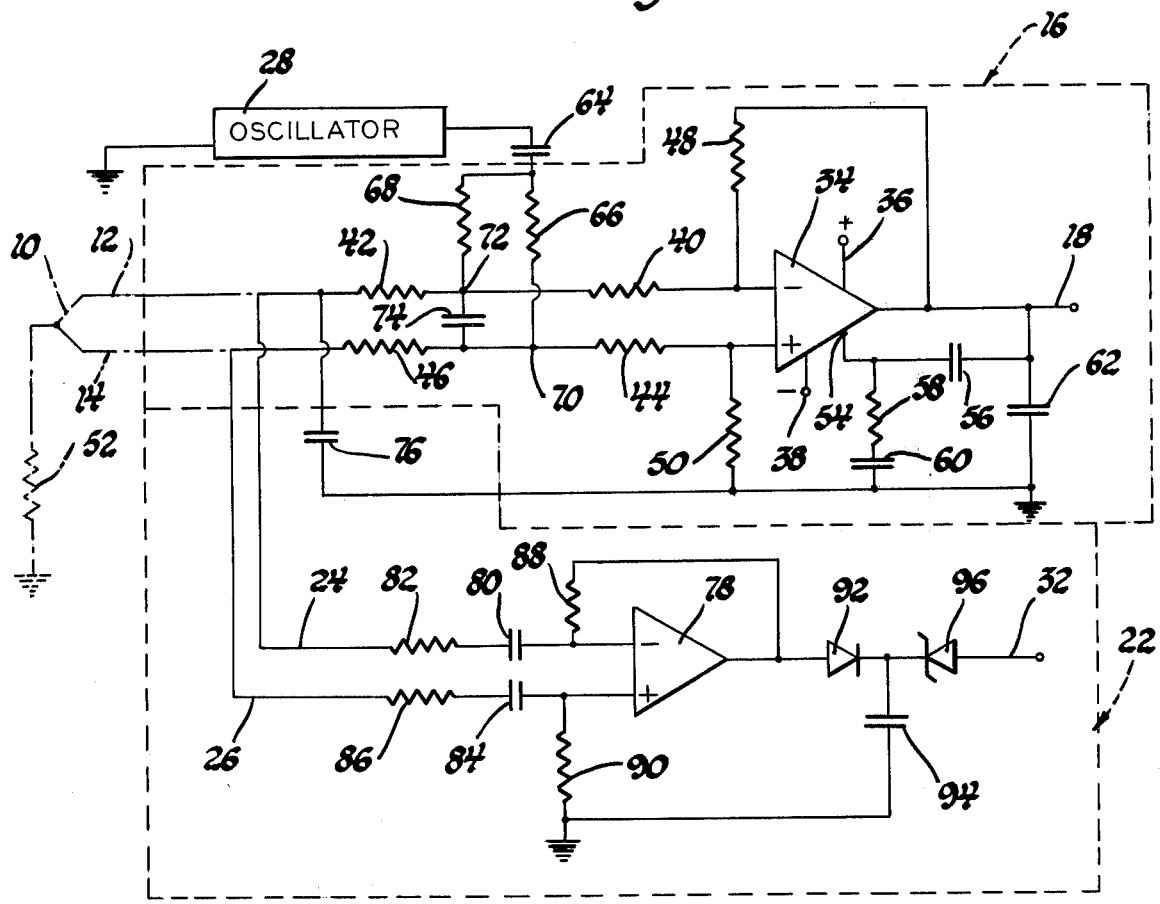

The above and other advantages will be made more apparent from the following specification taken in conjunction with the accompanying drawings wherein like reference numerals refer to like parts and wherein:

FIG. 1 is a block diagram of a thermocouple and its amplifier system as well as a thermocouple fault detector according to the invention, and FIG. 2 is a schematic circuit of the preamplifier and fault detector of FIG. 1.

Referring to the drawings, FIG. 1 shows a thermocouple 10 connected through thermocouple leads 12 and 14 to a preamplifier 16, the output of which is connected by line 18 to an amplifier 20. A fault detector circuit 22 is connected by lines 24 and 26 to the thermocouple leads 12 and 14, respectively. The output on line 32 of the fault detector 22 is connected to the amplifier 20. An oscillator 28, which plays a part in the fault detection scheme, is connected to the preamplifier 16. The overall operation of the circuit is that the DC signals from the thermocouple 10 are amplified by the preamplifier 16 and further amplified by the amplifier 20 to produce a usable output signal on an output line 30 which can be used to operate a display device or to influence a control apparatus. The fault detector 22 monitors the effects of a test signal from the oscillator 28 on the thermocouple leads 12 and 14. When the thermocouple circuit is closed, the fault detector produces no output, however, when the thermocouple circuit is opened, the fault detector 22 senses a resultant difference in the AC signals on the thermocouple leads and in response thereto produces an output signal on line 32 which disables the amplifier 20 to prevent the occurrence of spurious temperature signals on line 30. Line 32 may also be used to enable a warning device.

Referring to FIG. 2, the heart of the preamplifier 16 is an operational amplifier 34 connected as a differential amplifier and being provided with positive and negative power supply inputs 36 and 38, respecitvely. The negative signal input terminal of the amplifier 34 is connected through an input resistor 40 and a lead resistor 42 to the thermocouple lead 12 while the positive input terminal of the amplifier 34 is connected through an input resistor 44 and a lead resistor 46 to the thermocouple lead 14. A feedback resistor 48 is connected between the negative input terminal and the output terminal of the amplifier 34 while a resistor 50 is connected from the positive input terminal to ground. The resistors 48 and 50 are equal, the input resistors 40, 44 are equal and the lead resistors 42 and 46 are equal so that the gain of the preamplifier which is established by those resistors is equal with respect to signals applied to the positive and the negative terminals of the operational amplifier 34. Thus, the preamplifier is balanced for common mode rejection of input signals. That is, any noise or other signal which is applied equally to both preamplifier inputs will in effect be cancelled and have no effect on the amplifier output on line 18. A voltage difference on the inputs which arises from the operation of the thermocouple 10, however, is amplified and results in a proportional signal on line 18.

Due to the common mode rejection, the thermocouple 10 may float at some unknown voltage if it is isolated from ground without affecting the proper amplification of the thermocouple output. It is possible especially in the environment of a gas turbine engine for the thermocouple 10 to become directly shorted to ground or grounded through some resistance. That is indicated in FIG. 2 by a resistor 52 in dotted lines between the thermocouple junction and ground. The positive and negative power supply inputs to the operational amplifier 34 allow amplification of the thermocouple signal even when the thermocouple is grounded. It is required only that a voltage differential occur across the leads 12 and 14.

To assure stable operation of the preamplifier, a terminal 54 on the operational amplifier is connected through a capacitor 56 to the amplifier output and connected through a resistor 58 and series capacitor 60 to ground. A capacitor 62 is connected between the line 18 and ground to reject radio frequency interference. It will be seen that the preamplifier 16 as thus far described is conventional in structure and operation.

The oscillator 28 provides a square wave 10 kilohertz output signal which is furnished to both input networks of the preamplifier 16. The oscillator output is connected through a capacitor 64 and a pair of resistors 66 and 68 of the same value to junction points 70 and 72 respectively of the input resistors and lead resistors of the preamplifier inputs. The AC test signals applied to the inputs are in phase and of equal amplitude so that they represent a common mode voltage which is rejected by the differential amplifier 34 and do not influence the output thereof. To insure the equality of the AC signals on the two input lines, a large capacitor 74 is connected between the junction points 70 and 72. That capacitor represents a very low impedance to the AC signal thereby assuring that the AC signals on the two lines are essentially the same while maintaining DC isolation.

The fault detector 22 includes a large capacitor 76 connected between the thermocouple lead 12 and ground. That capacitor forms with the resistor 42 to a low pass filter so that the AC test signal on the lead 12 is attenuated. If the thermocouple circuit is closed, the test signal on line 14 is substantially identical with that on lead 12 since the thermocouple circuit impedance is very low and the leads 12 and 14 are at essentially the same AC voltage. An operational amplifier 78 is connected as a differential amplifier and has its negative input terminal coupled through a capacitor 80 and an input resistor 82 and line 24 to the thermocouple lead 12. A positive input of the operational amplifier 78 is coupled through a capacitor 84 and input resistor 86 and line 26 to the thermocouple lead 14. A feedback resistor 88 is connected from the negative input terminal of the operational amplifier to its output and a resistor 90 connects the positive input terminal to ground. The resistor pairs are matched as in the case of the preamplifier so that common mode rejection is achieved and the capacitive coupling to the operational amplifier, of course, achieves DC isolation.

The operational amplifier 78 compares the instantaneous amplitudes of input signals and produces an output only when unbalanced AC signals are present on the input lines 24, 26. The output of the amplifier 78 is connected through a diode 92 to a smoothing capacitor 94 which is connected to ground. The diode 92 is further connected to the cathode of a zener diode 96 which couples the amplifier to the output line 32. The effect of that amplifier circuit is to provide no output signal when the input signals on lines 24 and 26 are substantially the same. When, however, those signals are significantly unbalanced in amplitude or out of phase, output pulses will be produced by the amplifier 78 which are effective to charge the capacitor 94 to some value. If the input unbalance is large enough, the voltage on capacitor 94 will exceed the breakdown voltage of the zener diode 96 to pass a signal to the output line 32 thereby providing a warning of the input AC unbalance.

The oscillator 28 due to the capacitive coupling to the input circuit of the preamplifier 16 delivers essentially triangular wave form signals to the leads 12 and 14. Preferably the AC signals have an amplitude of about one volt peak-to-peak at the junctions 70 and 72. Due to the effect of the low pass filter, the signal passed to the thermocouple lead 12 will have a peak-to-peak amplitude of about 0.2 volts if the lead 12 is isolated from ground. In operation, if the thermocouple circuit is intact, whether grounded or not, the voltage on leads 12 and 14 will be substantially the same and the fault detector 22 will have a zero output. Assuming that the thermocouple is isolated from ground and either lead 12 or 14 is open or both of them are open, then the lead 12 will bear an AC signal of 0.2 volts peak-to-peak while the lead 14 will have a one volt peak-to-peak signal. Then the operational amplifier 78 which acts as a differential amplifier or comparator will sense the large difference in amplitudes as well as phase and will because of its high gain saturate at each pulse and charge the capacitor 94 sufficiently to produce an output on line 32 which signifies the open circuit. If the thermocouple is grounded or partially grounded and the line 14 is open, then the line 14 will have the one volt AC signal present but the AC voltage on line 12 will be zero or in any event less than 0.2 volts peak-to-peak according to the grounding condition. In that event, the output line 32 will be energized. In the case of the grounded thermocouple and line 12 is open, then the 0.2 volt AC signal will be imposed on line 12 whereas the line 14 voltage is indeterminate. It will be zero in the case of a short to ground but in the case of a partial grounding condition the voltage on line 14 could be higher. In any event, the basis of any voltage attenuation on line 14 would be purely resistive so that even if the AC voltage has the same amplitude as that on lead 12, the phase of the signals would be different and the comparator comprising the amplifier 78 would respond to the instantaneous voltage difference arising from the phase difference to produce an output on line 32.

It will thus be seen that the open thermocouple circuit detection apparatus according to this invention involves simple and inexpensive circuitry and yet provides a sensitive detector for an open circuit while being insensitive to grounding conditions of the thermocouple.

The embodiments of the invention in which an exclusive property or privilege is claimed are defined as follows:

1. In a thermocouple amplifier circuit for a thermocouple subject to being wholly or partially shorted to ground having means for detecting thermocouple open conditions, a differential amplifier having positive and negative input terminals, substantially equal input resistors connected to the input terminals, a low impedance thermocouple having first and second leads, a pair of substantially equal value lead resistors each connecting a thermocouple lead to one of said input resistors thereby providing common mode rejection of signals on both leads by the differential amplifier, an oscillator coupled to both junction points of lead resistors and input resistors for supplying common mode AC test signals to the lead resistors, so that when the thermocouple circuit is closed the instantaneous values of the test signals on the first and second leads are equal, a low pass filter operatively connected to the first lead and effective when the thermocouple circuit is open to attenuate and phase shift the test signal present on the first lead whereby the instantaneous values of the test signals on the first and second leads are substantially different when the thermocouple circuit is open, and means connected to the thermocouple leads to detect a substantial difference in instantaneous values of the test signals present on the leads to thereby detect an open circuit.

2. In a thermocouple amplifier circuit for a thermocouple subject to being wholly or partially shorted to ground having means for detecting thermocouple open conditions, a first differential amplifier having positive and negative input terminals, substantially equal input resistors connected to the input terminals, a low impedance thermocouple having first and second leads, a pair of substantially equal value lead resistors each connecting a thermocouple lead to one of said input resistors thereby providing common mode rejection of signals on both leads by the differential amplifier, an oscillator coupled to both junction points of lead resistors and input resistors for supplying common mode AC test signals to the lead resistors, so that when the thermocouple circuit is closed the instantaneous values of the test signals on the first and second leads are equal, a capacitor connected between the first lead in combination with a lead resistor and ground effective when the thermocouple circuit is open to attenuate and phase shift the test signal present on the first lead whereby the instantaneous values of the test signals on the first and second leads are substantially different when the thermocouple circuit is open, and a second differential amplifier coupled to the thermocouple leads to detect a substantial difference in instantaneous values of the test signals present on the leads to thereby detect an open circuit.

* * * * *